United States Patent [19]

Oguri

[11] Patent Number: 5,382,842
[45] Date of Patent: Jan. 17, 1995

[54] COMPOSITE LOGIC CIRCUIT WITH BIPOLAR TRANSISTOR-COMPLEMENTARY FIELD EFFECT TRANSISTOR

[75] Inventor: Takashi Oguri, Tokyo, Japan
[73] Assignee: NEC Corporation, Tokyo, Japan
[21] Appl. No.: 68,940
[22] Filed: May 28, 1993

[30] Foreign Application Priority Data

May 29, 1992 [JP] Japan .................. 4-138133

[51] Int. Cl.$^6$ ................ H03K 19/0175; H03K 19/02
[52] U.S. Cl. ...................................... 326/110; 326/84
[58] Field of Search ......................... 307/446, 475

[56] References Cited

U.S. PATENT DOCUMENTS

| | | | |
|---|---|---|---|
| 4,558,234 | 12/1985 | Suzuki et al. | 307/446 |
| 4,616,146 | 10/1986 | Lee | 307/446 |
| 4,638,186 | 1/1987 | McLaughlin | 307/446 |
| 4,769,561 | 9/1988 | Iwamura et al. | 307/446 |
| 4,808,845 | 2/1989 | Suziki et al. | 307/446 |
| 4,808,850 | 2/1989 | Masuda et al. | 307/446 |
| 4,813,020 | 3/1989 | Iwamura et al. | 307/446 |
| 4,816,705 | 3/1989 | Ohba et al. | 307/446 |
| 4,839,537 | 6/1989 | Ueno | 307/446 |
| 5,250,856 | 10/1993 | Burton et al. | 307/446 |

FOREIGN PATENT DOCUMENTS 2228813 9/1990 Japan .

Primary Examiner—Edward P. Westin
Assistant Examiner—Richard Roseen

[57] ABSTRACT

A BiMIS logic circuit includes a first bipolar junction transistor (BJT), a second BJT, a P-channel MIS transistor (PMIS), and an N-channel NMIS transistor (NMIS). A node between the first and second BJTs is connected to a first output terminal, and a node between the PMIS and the NMIS is connected to a second output terminal. When the potentials which cause the PMIS to turn ON and the NMIS to turn OFF are applied, a potential at the second output terminal rises to the power supply potential. The potential at the first output terminal assumes a potential lower than the power supply potential by a turn-on voltage ($V_F$) of the BJT. When the potentials which cause the NMIS to turn ON and the PMIS to turn OFF are applied, the second output terminal and a node between the NMIS and the second BJT are caused to become conductive whereby the potential at the second output terminal falls and the potential at the node rises and both the potentials are equalized. Here, the second BJT turns ON and the potential at the first output terminal falls. The base current supplied to the second BJT gradually ceases and the second BJT turns OFF accordingly. Since the base potential of the BJT at an output stage is always in the neighborhood of $V_F$, it is possible to cause the second BJT to turn ON or OFF by a minute change in the base current. Thus, a high speed performance is ensured even under a low power supply voltage.

7 Claims, 9 Drawing Sheets

COMPOSITE LOGIC CIRCUIT WITH BIPOLAR TRANSISTOR-COMPLEMENTARY FIELD EFFECT TRANSISTOR

BACKGROUND OF THE INVENTION (1) Field of the Invention

The present invention relates to a bipolar-MIS logic circuit in which bipolar transistors and MIS transistors are combined, and more particularly to a bipolar complementary MIS static logic circuit (hereinafter referred to as "BiCMIS logic circuit"), a dynamic logic circuit and a semiconductor integrated circuit, which are suited to an ultra high-speed operation where a power supply voltage is low.

(2) Description of the Related Art

A logic circuit which utilizes a combination of bipolar transistors and CMIS transistors and which is the so-called a BiCMIS logic circuit is disclosed, for example, in the U.S. Pat. Nos. 4,558,234; 4,616,146; 4,638,186; and 4,769,561.

FIG. 1 shows a BiCMIS logic circuit disclosed in the U.S. Pat. No. 4,769,561. The circuit is formed by two output bipolar transistors 11, 12 and four MIS transistors 13, 14, 15 and 16. This circuit is advantageous in view of low input capacitance, high output driving capability, high speed operation and low power consumption, and is widely used for memories in LSIs which require high performance. However, a problem in this circuit is that, although it can enjoy the above advantages at a power supply voltage in the neighborhood of 5 V, the high speed capability is suddenly lost at the power supply voltage in the neighborhood of 3 V. The deterioration of the high speed capability caused by the lowering of the power supply voltage is, as shown in FIG. 2, due especially to a remarkable increase in the falling delay of an output signal $S_{OUT}$ with respect to an input signal $S_{IN}$. FIG. 3 shows the power supply voltage dependency of such falling delay, in which a solid line represents the power supply voltage dependency of the CMIS logic circuit and a dotted line represents that of the BiCMIS logic circuit (inverter). As apparent from these graphs, in the conventional BiCMIS logic circuit, the advantage as a high speed logic is lost at supply voltages lower than 4.0 V.

The deterioration of the high speed capability, which is unique to the BiCMIS circuit, is mainly due to the fact that the base current of a bipolar junction transistor (hereinafter referred to as "BJT") suddenly decreases for such reason that a drain-source voltage $V_{ds}$ of the N-channel MIS transistor (hereinafter referred to as "NMIS") 15 is lowered due to a base-emitter voltage $V_{be}$.

FIG. 4 shows a circuit diagram disclosed in the U.S. Pat. No. 4,558,234. This circuit is formed by one bipolar transistor 21 and three MIS transistors 22, 23 and 24. This circuit utilizes the BJT 21 for an output pulling-up and the NMIS 22 for an output pulling-down. Since this circuit does not use a BJT as a pull-down transistor, there is no sudden speed deterioration even at a power supply voltage in the neighborhood of 3 V. However, since the NMIS 22 is employed for a pull-down transistor, the falling time of an output is greatly delayed when a heavy load capacitance is driven. If an attempt is made to improve the driving capability by increasing the conductance of the NMIS, the gate capacitance becomes large resulting in a deterioration of operation speed of a circuit of a previous stage. There is also a disadvantage in that a self-delay increases due to the transistor's own drain junction capacitance.

A trend today is that, for the power supply voltages in LSIs, the lowering of such voltages is inevitable in order to cope with the decrease in element resistance due to furtherance of miniaturization of semiconductor devices and to solve the problem brought about by a need for speeding up of systems or by an increase in power consumption due to higher integration in semiconductor devices. Thus, there is a strong desire for realization of a BiCMIS logic circuit which has the same high performance as the conventional circuit even when the power supply voltage is low.

With the conventional BiCMOS logic circuit explained above, a switching speed suddenly and largely deteriorates when the power supply voltage is lowered near to 3 V and this renders the circuit unsuited to a high speed logic circuit of the next generation.

SUMMARY OF THE INVENTION

Accordingly, it is an object of the present invention to provide an improved BiCMOS logic circuit which overcomes the problems existing in the conventional BiCMOS logic circuit as explained above.

Another object of the present invention is to provide a BJT-CMIS logic circuit and a semiconductor integrated circuit which is capable of maintaining a high speed operation under a low power supply voltage.

According to one aspect of the invention, there is provided a BiMIS logic circuit comprising:
- a first and a second input terminal;
- a first and a second output terminal;
- a first bipolar transistor having a collector connected to a power supply terminal and an emitter connected to the first output terminal;
- a second bipolar transistor having a collector connected to the first output terminal and an emitter connected to a reference potential;
- a first MIS transistor having a drain connected to a base of the first bipolar transistor and further connected to the second output terminal, a gate connected to the first input terminal, and a source connected to the power supply terminal; and
- a second MIS transistor having a drain connected to the base of the first bipolar transistor, a gate connected to the second input terminal, and a source connected to a base of the second bipolar transistor.

According to another aspect of the invention, there is also provided a BiMIS logic circuit comprising:
- a first bipolar transistor having a collector connected to a power supply terminal and an emitter connected to an output terminal;
- a second bipolar transistor having a collector connected to the output terminal and an emitter connected to a reference potential;
- a first MIS transistor having a drain connected to a base of the first bipolar transistor, a gate connected to an input terminal, and a source connected to the power supply terminal; and
- a second MIS transistor having a drain connected to the base of the first bipolar transistor, a gate connected to the input terminal, and a source connected to a base of the second bipolar transistor.

BRIEF DESCRIPTION OF THE DRAWINGS

The above and other objects, features and advantages of the present invention will be apparent from the following description of preferred embodiments of the invention explained with reference to the accompanying drawings, in which.

DESCRIPTION OF PREFERRED EMBODIMENTS

Now, the present invention is explained in detail on the preferred embodiments with reference to the drawings.

Figure 1:
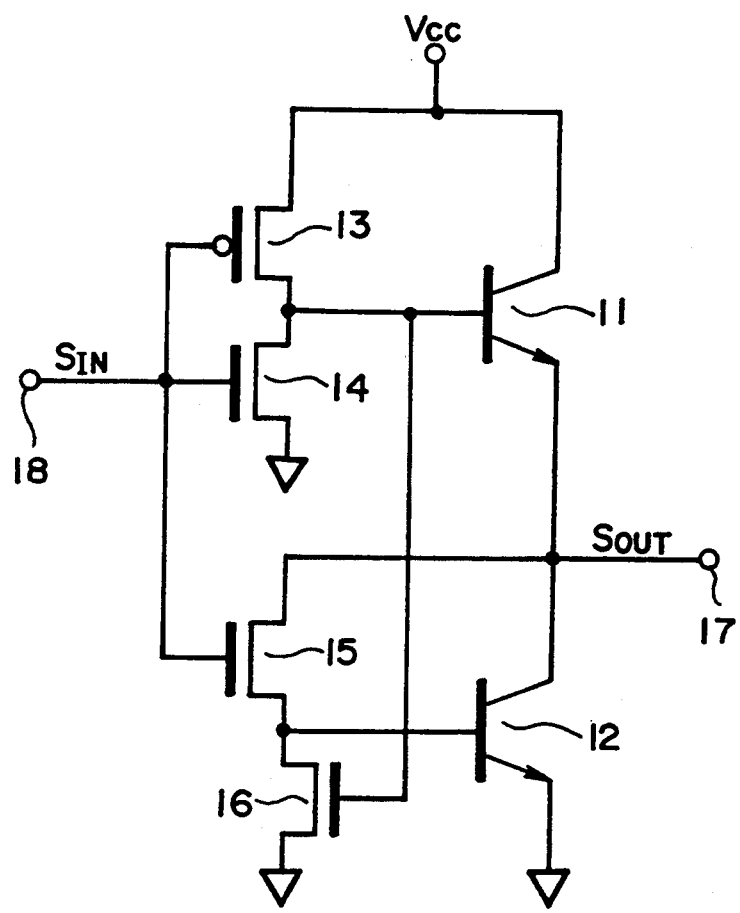
FIG. 1 is a circuit diagram showing an example of a prior art BJT-CMIS logic circuit.
Figure 2:
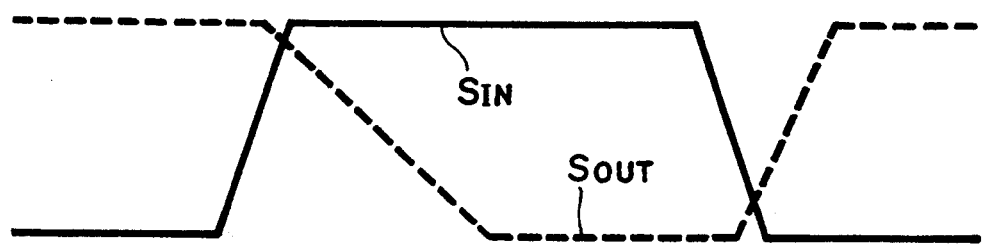
FIG. 2 is a diagram for illustrating performance of the circuit shown in FIG. 1.
Figure 3:
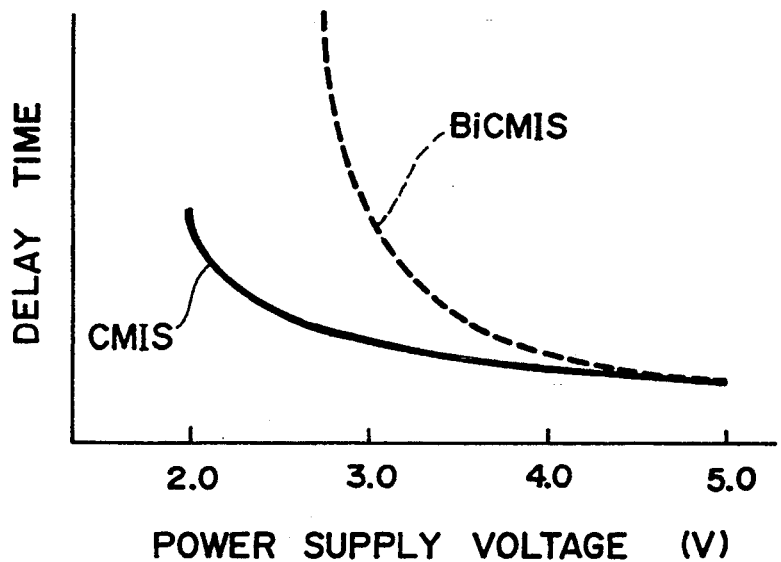
FIG. 3 is a graph showing a relationship between a delay time and a power supply voltage is the circuit shown in FIG. 1.
Figure 4:
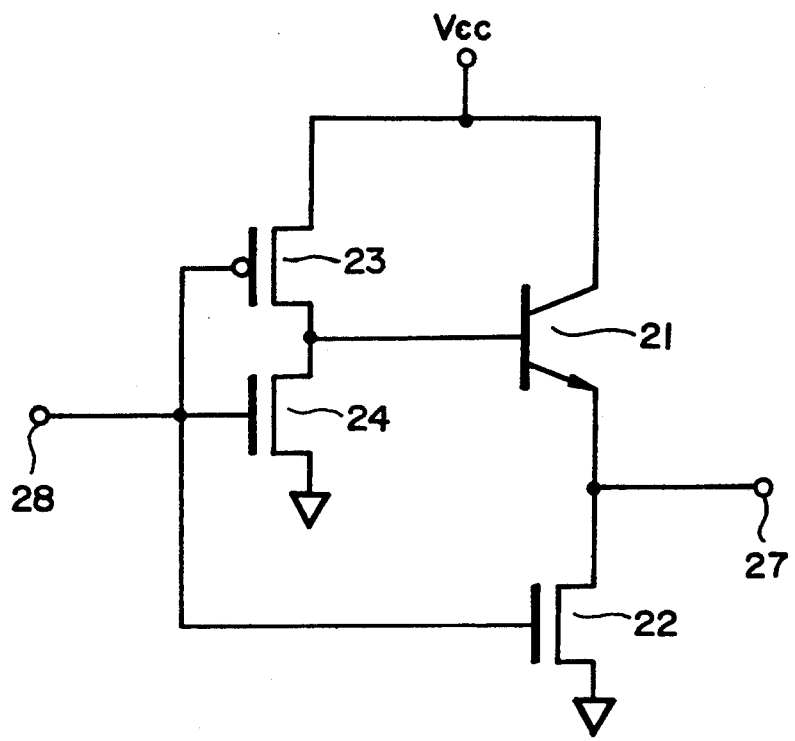
FIG. 4 is a circuit diagram showing a second example of a prior art BJT-CMIS logic circuit.
Figure 5:
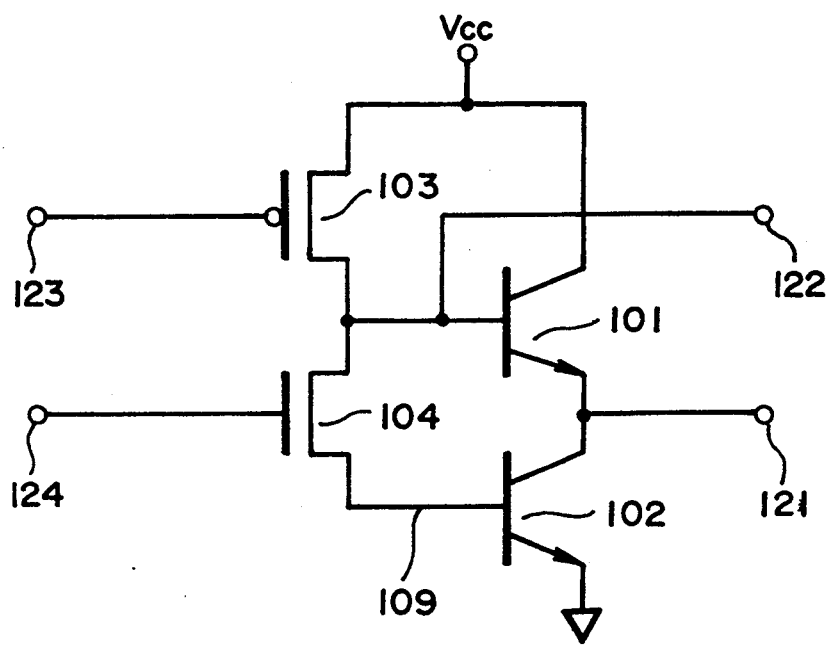
FIG. 5 is a circuit diagram showing a circuit of a first embodiment according to the invention.

FIG. 5 shows in diagram a circuit of the first embodiment according to the invention.

In the circuit of this embodiment, a first BJT 101 has a collector and an emitter connected respectively to a power supply terminal $V_{CC}$ ($V_{CC}$ also represents a power supply potential) and a first output terminal 121. A second BJT 102 has a collector and an emitter connected respectively to the first output terminal 121 and a reference potential, for example, a ground potential. A P-channel MIS transistor (hereinafter referred to as "PMIS") 103 has a drain, a gate and a source connected respectively to a base of the first BJT 101, a first input terminal 123 and the power supply terminal $V_{CC}$. An NMIS 104 has a drain, a gate and a source connected respectively to the base of the first BJT 101, a second input terminal 124 and a base of the second BJT 102. The drains of the PMIS 103 and NMIS 104 are connected to a second output terminal 122.

Now, the operation of the circuit of this embodiment is explained.

Here, it is assumed that the threshold voltage of the PMIS is $V_{TP}$, the threshold voltage of the NMIS is $V_{TN}$, and the turn-on voltage of the BJT is $V_F$.

Figure 6:
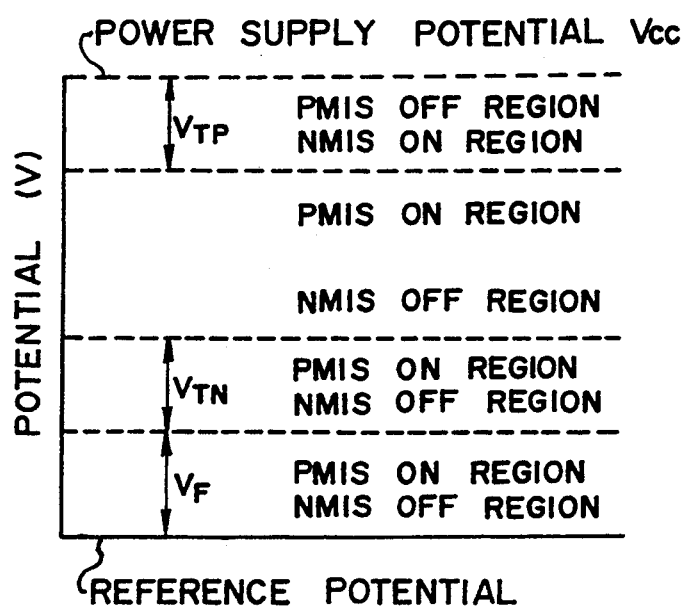
FIG. 6 is diagram for illustrating performance of the circuit of the first embodiment shown in FIG. 5.

FIG. 6 shows the ON/OFF conditions of the PMIS 103 and the NMIS 104 which are connected to the first and second input terminals 123 and 124, respectively. The PMIS 103 turns ON when the potential becomes lower than a potential in which $V_{TP}$ is subtracted from the power supply potential $V_{CC}$. The NMIS 104 turns ON when the potential becomes higher than a potential in which $V_F$ of the second BJT 102 and $V_{TN}$ of the NMIS 104 are added to the reference potential.

Here, it is assumed that the same signal is inputted to the first and second input terminals 123 and 124. When the level of the input signal is at a potential which causes the PMIS 103 to turn ON and the NMIS 104 to turn OFF (hereinafter referred to as "input low level potential"), a potential at the second output terminal 122 rises to the power supply potential $V_{CC}$ (hereinafter referred to as "second output high level potential"). The potential at a node (line) 109 falls to a potential at which the second BJT 102 turns OFF since the NMIS 104 turns OFF. Since the potential at the second output terminal 122 rises up to the power supply potential $V_{CC}$, a potential at the first output terminal 121 falls by $V_F$ (hereinafter referred to as "first output high level potential").

Figure 7:
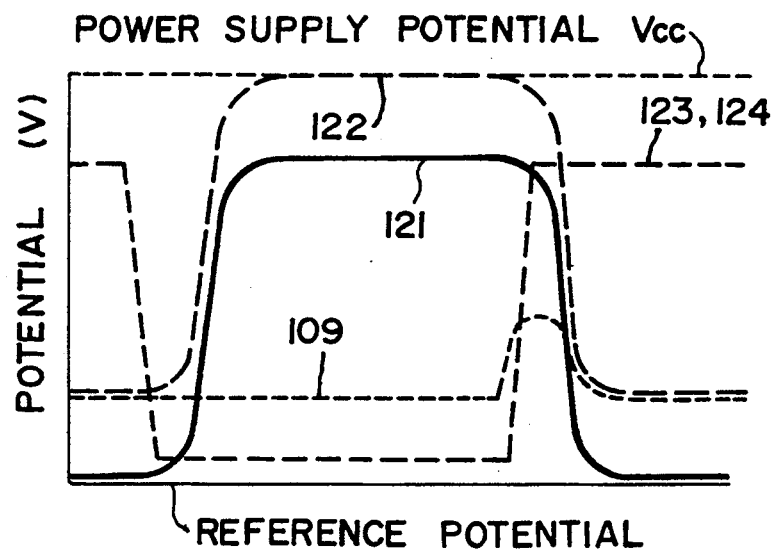
FIG. 7 is a graph showing a relationship between a voltage and a reference potential in the circuit of the first embodiment shown in FIG. 5.

When the potential which causes the PMIS 104 to turn ON and the PMIS 103 to turn OFF (hereinafter referred to as "input high level potential"), the second output terminal 122 and the node 109 are caused to become conductive whereby the potential at the second output terminal 122 falls and the potential at the node 109 rises so that, when both the potentials become the same, the changes in the potentials stop. Here, the sizes of the PMIS, NMIS and BJTs are adjusted so that the second BJT 102 turns to its ON state. When the second BJT 102 turns ON, the potential at the first output terminal 121 falls. Since the PMIS 103 is in its OFF state, the base current supplied to the second BJT 102 gradually ceases and this second BJT 102 turns OFF accordingly. Where the base current of the second BJT 102 and the load current at the first output terminal 121 are adjusted, the potential at the first output terminal 121 falls to the reference potential (hereinafter referred to as "first output low level potential"). The potential at the second output terminal 122 falls to a potential at which the second BJT 102 turns OFF (hereinafter referred to as "second output low level potential"). FIG. 7 shows transient waveforms obtained under the above state.

Figure 8:
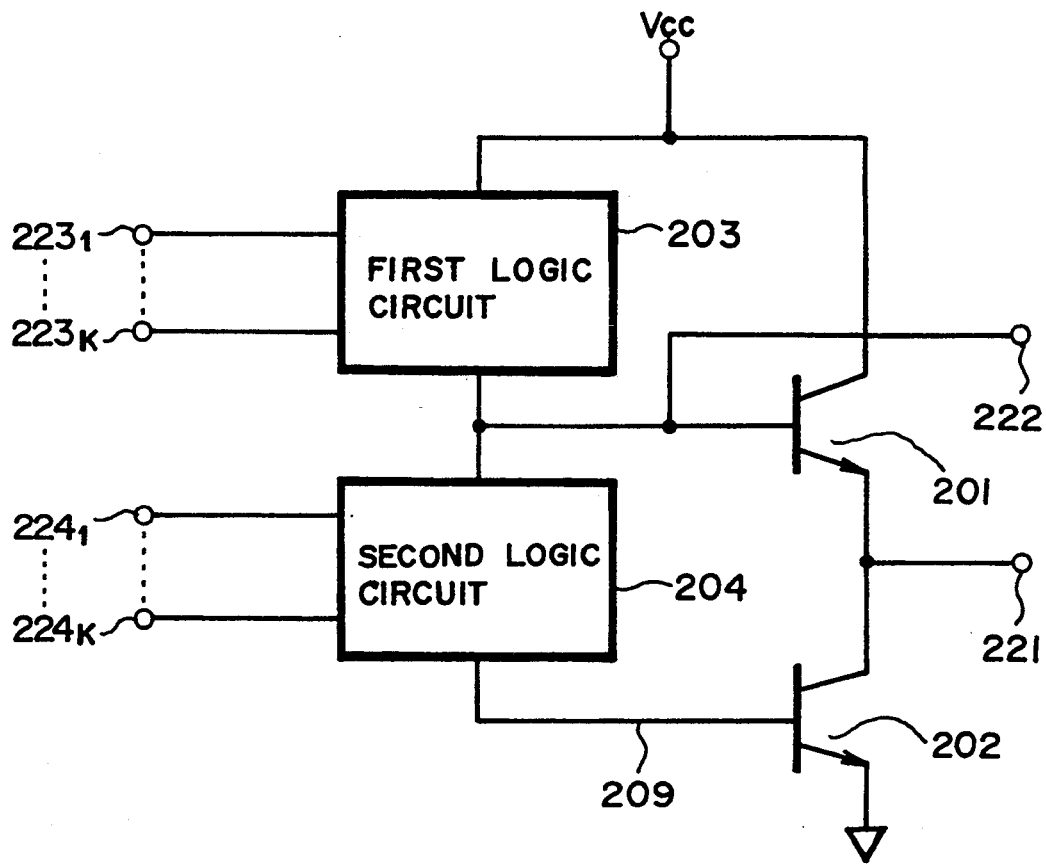
FIG. 8 is a circuit diagram showing a circuit of a second embodiment according to the invention.

FIG. 8 diagrammatically shows a circuit of the second embodiment according to the invention.

In the circuit of this embodiment, a first BJT 201 has a collector and an emitter connected respectively to an power supply terminal $V_{CC}$ and a first output terminal 221. A second BJT 202 has a collector and an emitter connected respectively to the first output terminal 221 and a reference potential, for example, a ground potential. A first logic circuit 203 is connected between the power supply terminal $V_{CC}$ and a base of the first BJT 201, and has k first input terminals $223_1$–$223_k$. A second logic circuit 204 is connected between the base of the first BJT 201 and the base of the second BJT 202, and has k second input terminals $224_1$–$224_k$.

Now, the operation of the circuit of this embodiment is explained.

Here, it is assumed that the same signal is inputted to the first and second input terminals $223_1$–$223_k$ and $224_1$–$224_k$. First, the state in which a NOR circuit is formed is explained. It is arranged such that the logic circuit 203 turns ON only when all of time k input signals applied to the k first input terminals $223_1$–$223_k$ are at the "input low level potential" and the logic circuit 204 turns ON when even one of the k input signals applied to the k second input terminals $224_1$–$224_k$ is at the "input high level potential", and thus the circuit operates in the same way as does the circuit of the first embodiment shown in FIG. 5. Next, the state in which a NAND circuit is formed is explained. It is arranged such that the logic circuit 203 turns ON when even one of the k input signals is at the "input low level potential" and the logic circuit 204 turns ON when all of the k input signals are at the "input high level potential", and thus the circuit operates in the same way as does the circuit of the first embodiment shown in FIG. 5.

Figure 9:
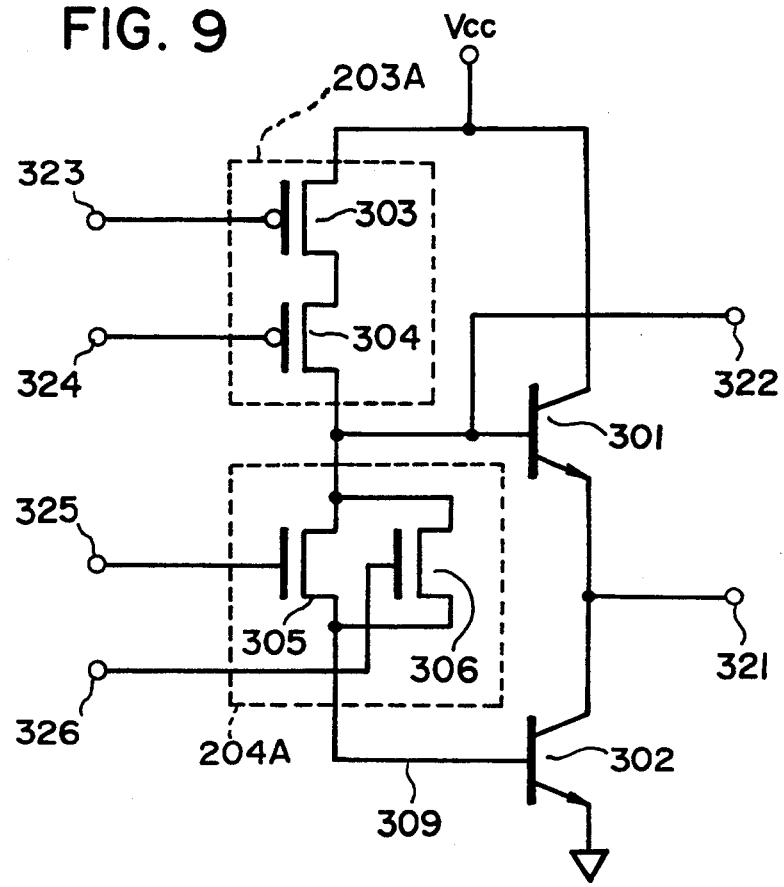
FIG. 9 is a circuit diagram showing a circuit of a third embodiment according to the invention, which includes further details of the circuit of the second embodiment shown in FIG. 8.

Now, with reference to FIG. 9, explanation is made on the third embodiment according to the invention, which details the second embodiment.

In this embodiment, a first BJT 301 has a collector and an emitter connected respectively to a power supply terminal $V_{CC}$ and a first output terminal 321; a second BJT 302 has a collector and an emitter connected respectively to the first output terminal 321 and a reference potential; a first PMIS 303 has a gate and a source connected respectively to a first input terminal 323 and the power supply terminal $V_{CC}$; a second PMIS 304 has a drain, a gate and a source connected to a base of the first BJT 301, a second input terminal 324 and a drain of the first PMIS 303, respectively; a first NMIS 305 has a drain, a gate and a source connected to the base of the first BJT 301, a third input terminal 325 and a base of the second BJT 302, respectively; and a second NMIS 306 has a drain, a gate and a source connected to the base of the first BJT 301, a fourth input terminal 326 and the base of the second BJT 302. Also, the drain of the second PMIS 304 is connected to a second output terminal 322.

Next, the operation of the circuit according to this third embodiment is explained.

The explanation is made on the assumption that the same signals are inputted to the input terminals 323 and 325, and to the input terminals 324 and 326. When the potentials which cause the PMISs 303 and 304 to be ON and the NMISs 305 and 306 to be OFF are applied, the potential at the second output terminal 322 rises to the power supply potential $V_{CC}$. Also, since the NMISs 305 and 306 turn OFF, the potential at the node 309 falls to a potential at which the second BJT 302 turns OFF. Since the potential at the second output terminal 322 rises to the power supply potential $V_{CC}$, the potential at the first output terminal 321 becomes a potential which is lower than $V_{CC}$ by $V_F$.

When the potential which causes the NMIS 305 to be ON and the PMIS 303 to be OFF, the second output terminal 322 and the node 309 become conductive whereby the potential at the output terminal 322 drops and the potential at the node 309 rises. This results in both the potentials becoming the same with each other and the operation ceases. Here, the sizes of the PMISs, NMISs and BJTs are adjusted so that the second BJT 302 may turn to an ON state. When the second BJT 302 is turned ON, the potential at the first output terminal 321 drops. Since the PMIS 303 is in its OFF state, the base current supplied to the second BJT 302 gradually decreases and the second BJT 302 turns OFF accordingly. Where the base current of the second BJT 302 and the load current at the first output terminal 321 are adjusted, the potential at the first output terminal 321 drops to the reference potential. Also, the potential at the second output terminal 322 drops to the potential at which the second BJT 302 turns OFF.

Now, reference is made to an example in which further details are included in the second embodiment.

Figure 10:
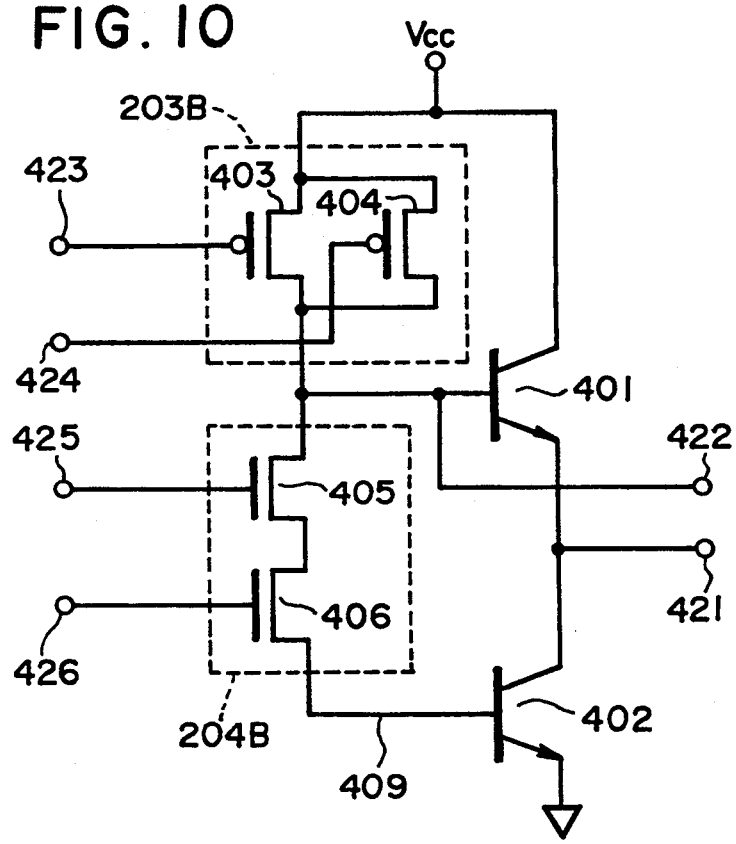
FIG. 10 is a circuit diagram showing a circuit of a fourth embodiment according to the invention, which includes further details of the circuit of the second embodiment in FIG. 8.

FIG. 10 shows the example as the fourth embodiment of the invention. In this embodiment, a first BJT 401 has a collector and an emitter connected respectively to a power supply terminal $V_{CC}$ and a first output terminal 421; a second BJT 402 has a collector and an emitter connected respectively to the first output terminal 421 and a reference potential; a first PMIS 403 has a drain, a gate and a source connected to the base of the first BJT 401, a first input terminal 423 and the power supply terminal $V_{CC}$, respectively; a second PMIS 404 has a drain, a gate and a source connected to the base of the first BJT 401, a second input terminal 424 and the power supply terminal $V_{CC}$, respectively; a first NMIS 405 has a drain and a gate connected respectively to the base of the first BJT 401 and a third input terminal 425; and a second NMIS 406 has a drain, a gate and a source connected to the source of the first NMIS 405, a fourth input terminal 426 and the base of the second BJT 402, respectively. Also, the drains of the first and second PMISs 403 and 404 are connected to a second output terminal 422.

Now, the operation of this fourth embodiment is explained.

The explanation is made on the assumption that the same signals are inputted to the input terminals 423 and 425, and to the input terminals 424 and 426. When the potential which causes the PMIS 403 to be ON and the NMIS 405 to be OFF is applied, the potential at the second output terminal 422 rises to the power supply potential $V_{CC}$. Also, since the NMIS 405 turns OFF, the potential at the node 409 falls to a potential at which the second BJT 402 turns OFF. Since the output of the second output terminal 422 rises to the power supply potential $V_{CC}$, the potential at the first output terminal 421 becomes a potential which is lower than $V_{CC}$ by $V_F$.

When the potentials which cause the NMISs 405 and 406 to be ON and the PMISs 403 and 404 to be OFF are applied, the second output terminal 422 and the node 409 become conductive whereby the potential at the second output terminal 422 falls and the potential at the node 409 rises so that, when both the potentials become the same, the changes in the potentials stop. Here, the sizes of the PMISs, NMISs and BJTs are adjusted so that the second BJT 402 turns to its ON state. Where the second BJT 402 turns ON, the potential at the first output terminal 421 falls. Since the PMISs 403 and 404 are in their OFF state, the base current supplied to the second BJT 402 gradually ceases and this second BJT 402 turns OFF accordingly. Where the base current of the second BJT 402 and the load current at the first output terminal 421 are adjusted, the potential at the first output terminal 421 falls to the reference potential. The potential at the second output terminal 422 falls to a potential at which the second BJT 402 turns OFF.

Figure 11:
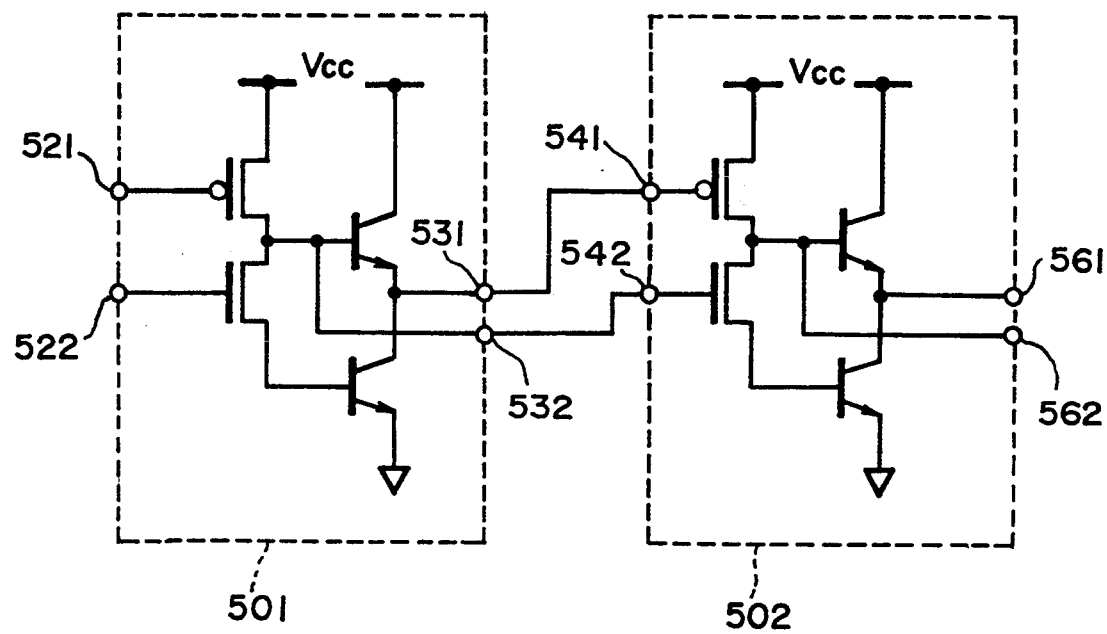
FIG. 11 is a circuit diagram showing a circuit of a fifth embodiment according to the invention.

FIG. 11 shows the fifth embodiment of the invention. It is shown therein a way in which the BiMIS logic circuit illustrated in FIG. 5 is connected in a plurality of stages. A first BiMIS logic circuit 501 has a first input terminal 521 and a second input terminal, and a first output terminal 531 and a second output terminal 532. A second BiMIS logic circuit 502 has a first input terminal 541 and a second input terminal 542, and a first output terminal 561 and a second output terminal 562. The first and second output terminals 531 and 532 of the first BiMIS logic circuit 501 are connected to the first and second input terminals 541 and 542 of the second BiMIS logic circuit 502.

Next, the operation of this fifth embodiment is explained.

As already explained with respect to the embodiment shown in FIG. 5, when the "input low level potential" is applied to the input terminals 521 and 522, a high level potential dropped by $V_F$ from the power supply potential $V_{CC}$ is outputted from the first output terminal 531 and a high level potential raised up to the power supply $V_{CC}$ is outputted from the second output terminal 532. Also, when the "input high level potential" is applied to the input terminals 521 and 522, a low level potential dropped to the reference potential is outputted from the first output terminal 531 and a low level potential raised by $V_F$ from the reference potential is outputted from the second output terminal 532.

Figure 12:
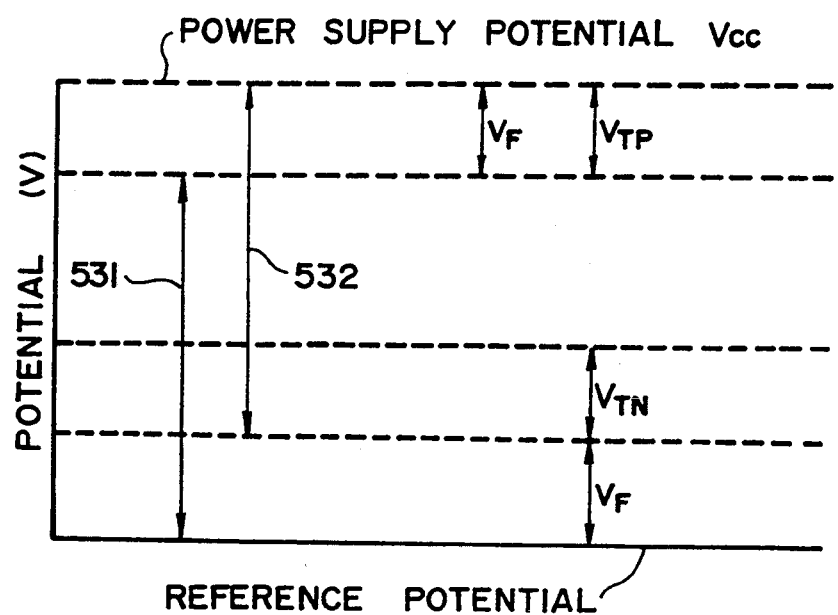
FIG. 12 is a diagram illustrating performance of the circuit of the fifth embodiment shown in FIG. 11.

In the case where the second input terminal 542 of the second BiMIS logic circuit 502 is connected to the second output terminal 532 of the first BiMIS logic circuit 501 of the previous stage, the amplitude is reduced by the base-emitter potential $V_{be}$ of the BJT, thereby resulting in a high speed switching operation. FIG. 12 is a diagram illustrating performance of the above circuit.

Figure 13:
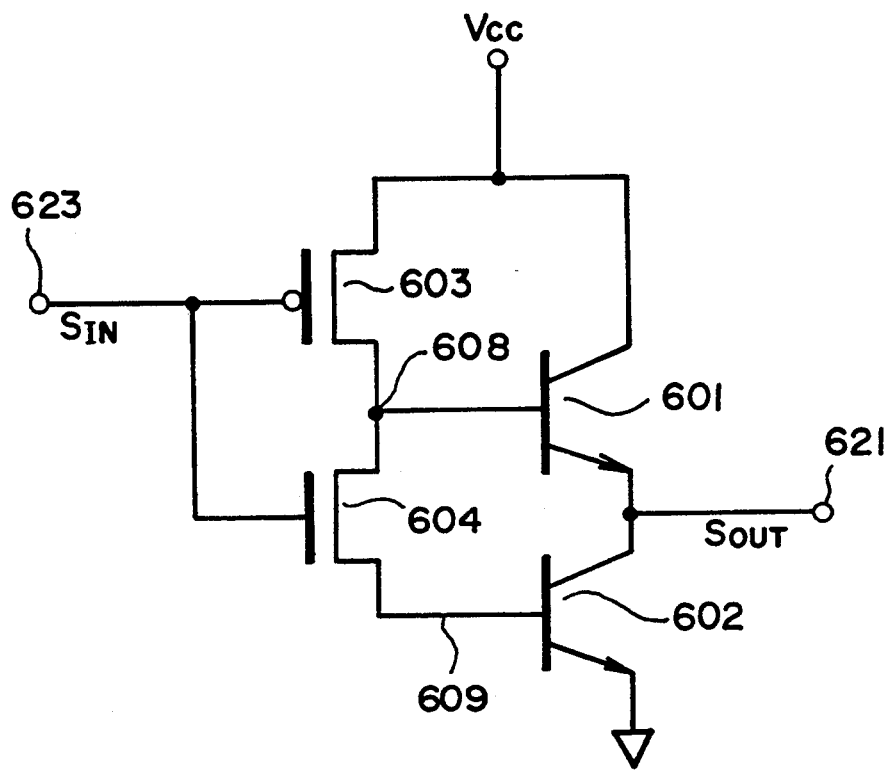
FIG. 13 is a circuit diagram showing a circuit of a sixth embodiment according to the invention.

FIG. 13 is a circuit diagram showing the sixth embodiment of the invention.

In this embodiment, a first BJT 601 has a collector and an emitter connected respectively to a power supply terminal $V_{CC}$ and an output terminal 621; a second BJT 602 has a collector and an emitter connected respectively to the output terminal 621 and a reference potential, for example, a ground potential; a PMIS 603 has a drain, a gate and a source connected to a base of the first BJT 601, an input terminal 623 and the power supply terminal $V_{CC}$, respectively; and an NMIS 604 has a drain, a gate and a source connected to the base of the first BJT 601, the input terminal 623 and a base of the second BJT 602, respectively.

Next, the operation of this sixth embodiment is explained.

When the potential which causes the PMIS 603 to turn ON and the NMIS 604 to turn OFF is applied to the input terminal 623, the potential at a node 608 rises to the power supply potential $V_{CC}$. Also, since the NMIS 604 turns OFF, the potential at a node 609 falls to a potential at which the second BJT 602 turns OFF. Since the potential at the node 608 rises to the power supply potential $V_{CC}$, the potential at the output terminal 621 becomes a potential which is lower by $V_F$ from the power supply potential $V_{CC}$.

On the other hand, when the potential which causes the NMIS 604 to turn ON and the PMIS 603 to turn OFF is applied to the input terminal 623, the node 608 and the node 609 become conductive whereby the potential at the node 608 falls and the potential at the node 609 rises so that, when both the potentials become the same, the changes in the potentials stop. Here, the sizes of the PMIS, NMIS and BJTs are adjusted so that the second BJT 602 turns to its ON state. Where the second BJT 602 turns ON, the potential at the output terminal 621 falls. Since the PMIS 603 is in its OFF state, the base current supplied to the second BJT 602 gradually ceases and this second BJT 602 turns OFF accordingly. Where the base current of the second BJT 602 and the load current at the output terminal 621 are adjusted, the potential at the output terminal 621 falls to the reference potential. Also, the potential at the node 608 falls to a potential at which the second BJT 602 turns OFF.

Figure 14:
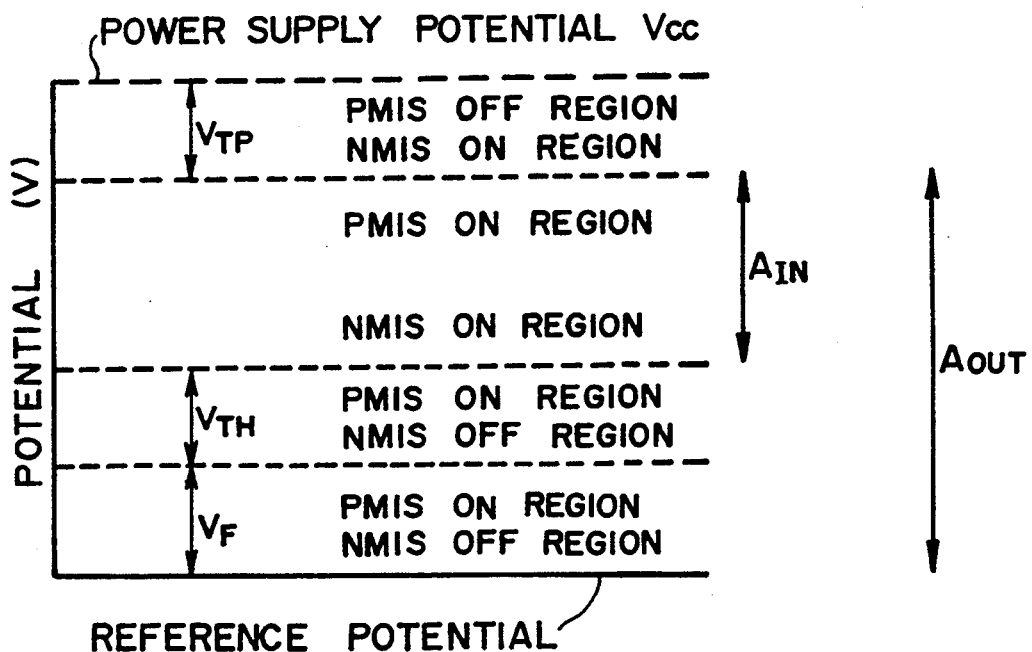
FIG. 14 is a diagram for illustrating performance of the circuit off the sixth embodiment shown in FIG. 13.

FIG. 14 shows the potentials associated with the above explained operation. When the "input high level potential" and the "input low level potential" applied to the input terminal 623 are adjusted, it is possible to achieve the level conversion from the input amplitude $A_{IN}$ of the signal $S_{IN}$ applied to the input terminal 623 into the output amplitude $A_{OUT}$ of the signal $S_{OUT}$ outputted from the output terminal 621.

Figure 15:
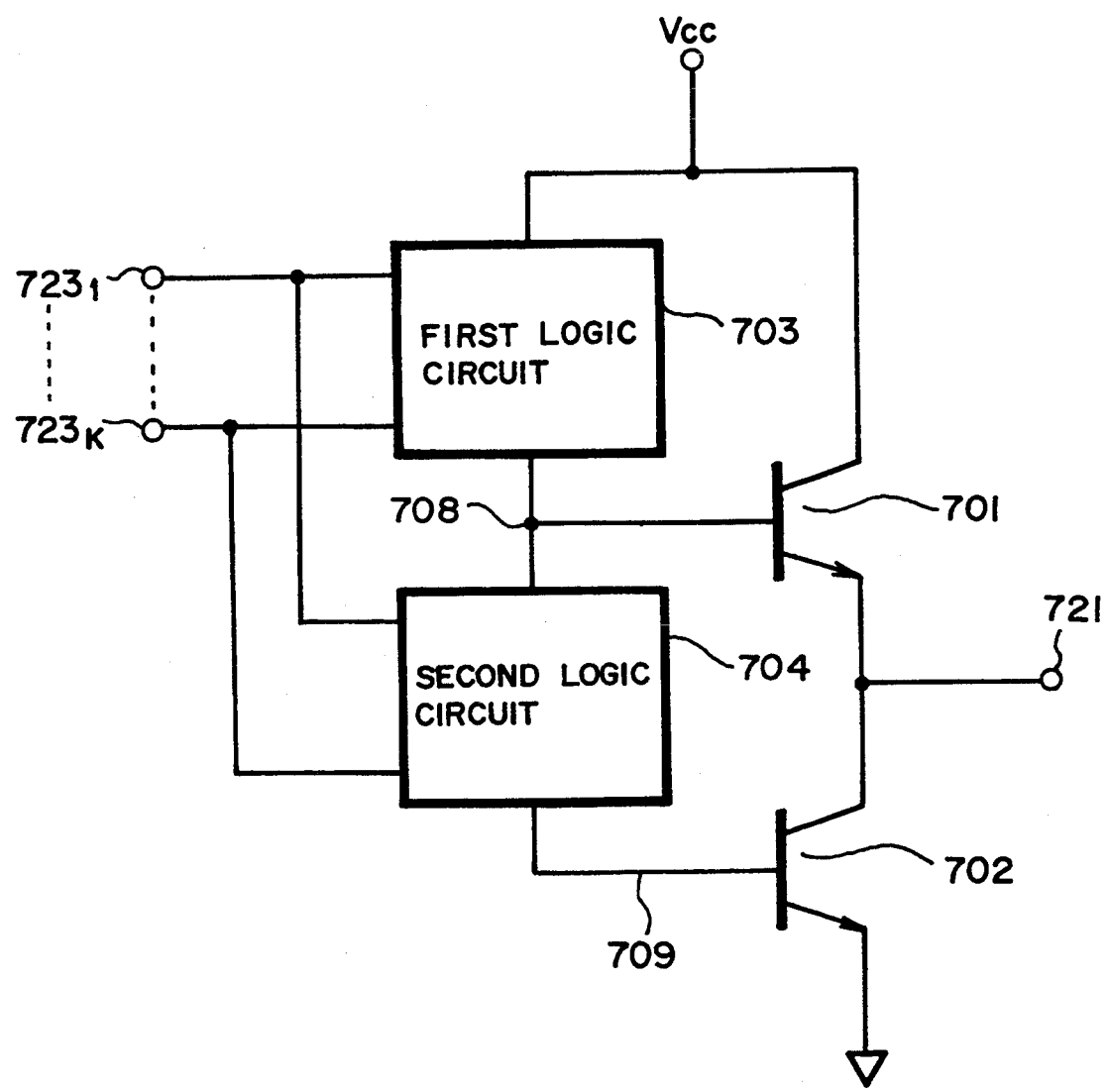
FIG. 15 is a circuit diagram showing a circuit of a seventh embodiment according to the invention.

FIG. 15 is a circuit diagram showing the seventh embodiment of the invention.

In the circuit of this embodiment, a first BJT 701 has a collector and an emitter connected respectively to a power supply terminal $V_{CC}$ and an output terminal 721; a second BJT 702 has a collector and an emitter connected respectively to the output terminal 721 and a reference potential; a first logic circuit 703 is connected between the power supply terminal $V_{CC}$ and a base of the first BJT 701 and is connected to k input terminals $723_1$-$723_k$; and a second logic circuit 704 is connected between the base of the first BJT 701 and the base of the second BJT 702 and is connected to the k input terminals $723_1$-$723_k$.

Next, the operation of the circuit according to this seventh embodiment is explained.

First, how a NOR circuit is formed is explained. The first logic circuit 703 turns ON only when all of the k input signals applied to the k input terminals are at the "input low level potential", and the second logic circuit 704 turns ON when even one of the k input signals is at the "input high level potential". This results in the same operation as that in the circuit illustrated in FIG. 13. Next, how a NAND circuit is formed is explained. The first logic circuit 703 turns ON when even one of the k input signals is at the "input low level potential", and the second logic circuit 704 turns ON only when all of the k input signals are at the "input high level potential". The operation is similar to that in the circuit shown in FIG. 13.

Figure 16:
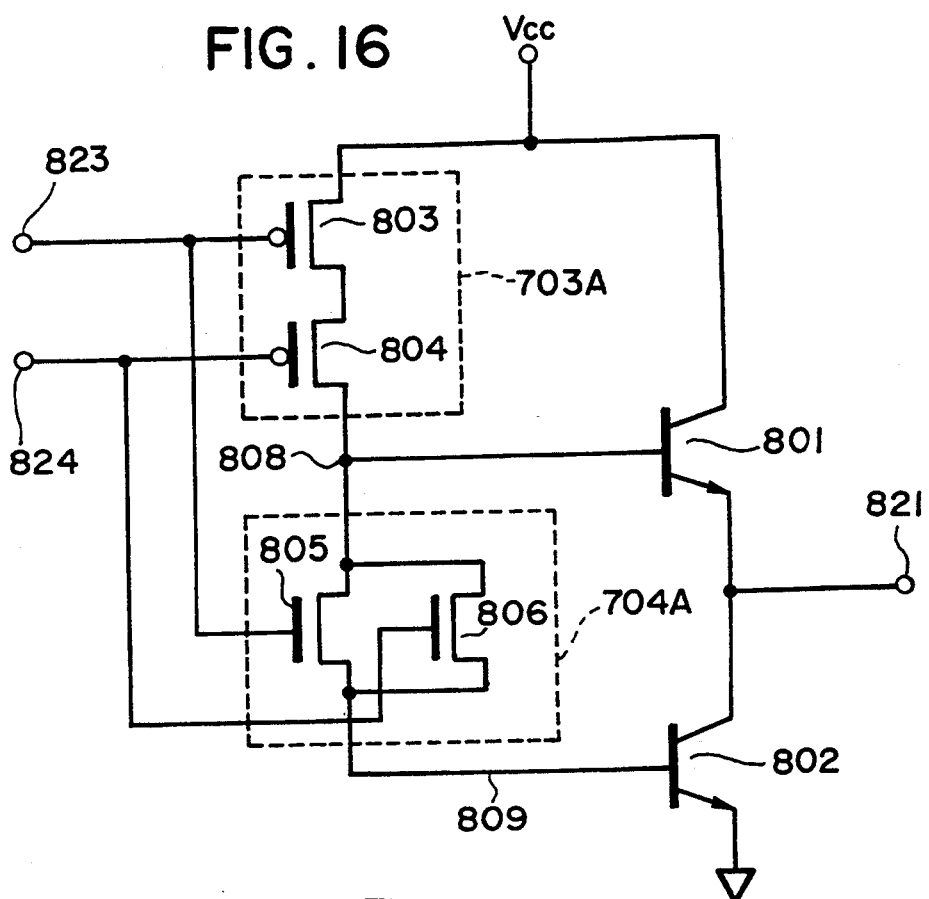
FIG. 16 is a circuit, diagram showing a circuit of an eighth embodiment according to the invention, which includes further details of the circuit of the seventh embodiment shown in FIG. 15.

Now, reference is made to an example in which further details are included In the above seventh embodiment. Such example is shown in FIG. 16 as the eighth embodiment of the invention.

In this embodiment, a first BJT 801 has a collector and an emitter connected respectively to a power supply terminal $V_{CC}$ and an output terminal 821; a second BJT 802 has a collector and an emitter connected respectively to the output terminal 821 and a reference potential; a first PMIS 803 has a gate and a source connected respectively to a first input terminal 823 and the power supply terminal $V_{CC}$; a second PMIS 804 has a drain, a gate and a source connected to a base of the first BJT 801, a second input terminal 824 and a drain of the first PMIS 803, respectively; a first NMIS 805 has a drain, a gate and a source connected to the base of the first BJT 801, the first input terminal 823 and a base of the second BJT 802, respectively; and a second NMIS 806 has a drain, a gate and a source connected to the base of the first BJT 801, the second input terminal 824 and the base of the second BJT 802, respectively.

Now, the operation of the circuit according to this seventh embodiment is explained. When the potentials which cause the PMISs 803 and 804 to turn ON and the NMISs 805 and 806 to turn OFF, the potential at the node 808 rises to the power supply potential $V_{CC}$. Also, since the NMISs 805 and 806 turn OFF, the potential at the node 809 falls to a potential at which the second BJT 802 turns OFF. Since the potential at the node 808 rises to the power supply potential $V_{CC}$, the potential at the output terminal 821 becomes a potential which is lower from the power supply potential $V_{CC}$ by $V_F$.

When the potential which causes the NMIS 805 to turn ON and the PMIS 803 to turn OFF is applied, the node 808 and the node 809 become conductive whereby the potential at the node 808 falls and the potential at the node 809 rises so that, when both the potentials become the same, the changes in the potentials stop. Here, the sizes of the PMISs, NMISs and BJTs are adjusted so that the second BJT 802 turns to its ON state. Where the second BJT 802 turns ON, the potential at the output terminal 821 falls. Since the PMIS 803 is in its OFF state, the base current supplied to the second BJT 802 gradually ceases and this second BJT 802 turns OFF accordingly. Where the base current of the second BJT 802 and the load current at the output terminal 821 are adjusted, the potential at the output terminal 821 falls to the reference potential. Also, the potential at the node 808 falls to a potential at which the second BJT 802 turns OFF. Thus, in this embodiment, it is possible to realize a level conversion circuit having a two-input NOR logic function.

Figure 17:
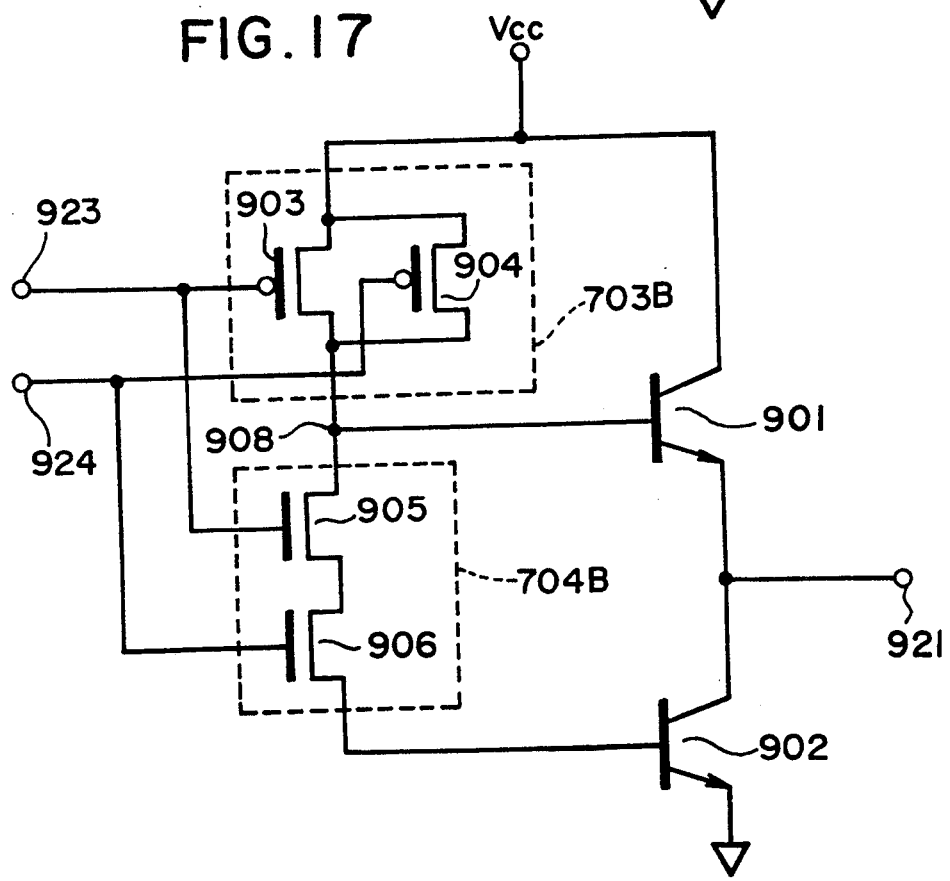
FIG. 17 is a circuit diagram showing a circuit of a ninth embodiment according to the invention, which includes further details of the circuit of the seventh embodiment shown in FIG. 15.

Now, explanation is made on an example in which further details are included in the seventh embodiment. FIG. 17 shows this example as the ninth embodiment of the invention.

In this embodiment, a first BJT 901 has a collector and an emitter connected respectively to a power supply terminal $V_{CC}$ and an output terminal 921; a second BJT 902 has a collector and an emitter connected respectively to the output terminal 921 and a reference potential; a first PMIS 903 has a drain, a gate and a source connected to a base of the first BJT 901, a first input terminal 923 and the power supply terminal $V_{CC}$, respectively; a second PMIS 904 has a drain, a gate and a source connected to the base of the first BJT 901, a second input signal terminal 924 and the power supply terminal $V_{CC}$, respectively; a first NMIS 905 has a drain and a gate connected respectively to the base of the first BJT 901 and the first input terminal 923; and a second NMIS 906 has a drain, a gate and a source connected to a source of the first NMIS 905, the second input terminal 924 and the base of the second BJT 902, respectively.

Now, the operation of the circuit according to this ninth embodiment is explained.

When the potential which causes the PMIS 903 to turn ON and the NMIS 905 to turn OFF is applied, the potential at the node 908 rises to the power supply potential $V_{CC}$. Also, since the NMIS 905 turns OFF, the potential at the node 909 falls to a potential at which the second BJT 902 turns OFF. Since the potential at the node 908 rises up to the power supply potential $V_{CC}$, the potential at the output terminal 921 becomes a potential which is lower than the power supply potential $V_{CC}$ by $V_F$.

When the potentials which cause the NMISs 905 and 906 to be ON and the PMISs 903 and 904 to be OFF are applied to the input terminals 923 and 924, the node 908 and the node 909 become conductive whereby the potential at the node 908 falls and the potential at the node 909 rises so that, when both the potentials become the same, the changes in the potentials stop. Here, the sizes of the PMISs, NMISs and BJTs are adjusted so that the second BJT 902 turns to its ON state. Where the second BJT 902 turns ON, the potential at the output terminal 921 falls. Since the PMISs 903 and 904 are in their OFF state, the base current supplied to the second BJT 902 gradually ceases and this second BJT 902 turns OFF accordingly. Where the base current of the second BJT 902 and the load current at the output terminal 921 are adjusted, the potential at the output terminal 921 falls to the reference potential. The potential at the node 908 falls to a potential at which the second BJT 902 turns OFF. Thus, according to this embodiment, it is possible to realize a level conversion circuit having a two-input NAND logic function.

In the BiMIS logic circuit of the first embodiment shown In FIG. 5, by allowing the threshold voltage of the second MIS transistor to become minus (depletion type device), the input signal lines connected to the PMIS and the NMIS shown in FIG. 5 are unified to one line. This contributes to simplifying the circuit configuration. Similarly, in the BiMIS logic circuit of the second embodiment shown in FIG. 8, the input signal lines are unified to one line. Further. In the BiMIS logic circuit shown in FIG. 15, by having the threshold voltage of the MIS transistors adjusted, the change in the level of input logical amplitude is made possible. The change in the level of output logical amplitude is made possible by having the reference potential and the power supply potential adjusted.

As explained hereinabove, according to the present invention, since the base potential of the bipolar transistor at an output stage is always kept in the neighborhood of the turn-on voltage $V_F$, it is possible to cause the BJT to turn ON or OFF by a minute change in the base current. Thus, there is no appearance of the increase in the self-delay caused by a decrease in the input signal amplitude unlike the case in the conventional circuits of BiCMIS, BiNMIS, etc. Consequently, it is possible to achieve the capability of a high speed operation even under a small amplitude operation below 3 V. This enables to realize a high speed circuit using a miniaturized device of less than 0.5 $\mu$m. Also, when the invention is utilized in an LSI, it is possible to make the reduction in power consumption in proportion to the lowering of the power supply voltage. Also, as compared with the conventional BiCMIS logic circuit, since the base and the collector of the second BJT at the output stage are not short-circuitted, the collector currents exist even where the emitter-collector voltage $V_{ec}$ is in the neighborhood of 0 V. Thus, it is possible to have the output lowered to the reference potential.

Also, according to the invention, it may be arranged for the conventional drive circuit to possess the level conversion function so that the independent level conversion circuit required in the conventional circuit can be eliminated, which makes it possible to reduce a delay time and also power consumption. Furthermore, since the level conversion can be effected in a logic type, the logic gates normally connected to output terminals of the conventional driver can be incorporated in the circuit according to the invention. In this way, a delay time is further reduced.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A BiMIS logic circuit arrangement comprising a plurality of BiMIS logic circuits connected in cascade so as to constitute a multi-stage logic circuit, each BiMIS logic circuit comprising:
   a first and a second input terminal;
   a first and a second output terminal;
   a first bipolar transistor having a collector connected to a power supply terminal and an emitter connected to said first output terminal;
   a second bipolar transistor having a collector connected to said first output terminal and an emitter connected to a reference potential;
   a first MIS transistor having a drain connected to a base of said first bipolar transistor and further connected to said second output terminal, a gate connected to said first input terminal, and a source connected to the power supply terminal; and
   a second MIS transistor having a drain connected to the base of the first bipolar transistor, a gate connected to said second input terminal, and a source connected to a base of said second bipolar transistor,
   wherein the first and second output terminals of one of said plurality of BiMIS logic circuits are respectively connected to the first and second input terminals of a next stage BiMIS logic circuit.

2. A BiMIS logic circuit arrangement according to claim 1, in which said first and second MIS transistors are of a P-channel type and an N-channel type, respectively.

3. A BiMIS logic circuit arrangement comprising a plurality of BiMIS logic circuits connected in cascade so as to constitute a multi-stage logic circuit, each BiMIS logic circuit comprising:
   a first and a second output terminal;
   a first bipolar transistor having a collector connected to a power supply terminal and an emitter connected to said first output terminal;
   a second bipolar transistor having a collector connected to said first output terminal and an emitter connected to a reference potential;
   a first logic circuit connected between said power supply terminal and a base of said first bipolar transistor and having k first input terminals ($k \geq 2$); and
   a second logic circuit connected between the base of said first bipolar transistor and a base of said second bipolar transistor and having k second input terminals, said second output terminal being connected to a junction node between said first and second logic circuits,
   wherein the first and second output terminals of one of said plurality of BiMIS logic circuits are respectively connected to the first and second input terminals of a next stage BiMIS logic circuit.

4. A BiMIS logic circuit arrangement according to claim 3, in which said first logic circuit includes a plurality of first MIS transistors connected in series between said power supply terminal and the base of said first bipolar transistor, and said second logic circuit includes a plurality of second MIS transistors connected in parallel between the base of said first bipolar transistor and the base of said second bipolar transistor.

5. A BiMIS logic circuit arrangement according to claim 4, in which said first and second MIS transistors are of a P-channel type and an N-channel type, respectively.

6. A BiMIS logic circuit arrangement according to claim 3, in which said first logic circuit includes a plurality of first MIS transistors connected in parallel between said power supply terminal and the base of said first bipolar transistor, and said second logic circuit includes a plurality of second MIS transistors connected in series between the base of said first bipolar transistor and the base of said second bipolar transistor.

7. A BiMIS logic circuit arrangement according to claim 6, in which said first and second MIS transistors are of a P-channel type and an N-channel type, respectively.

* * * * *